(12) United States Patent
Dorn

(10) Patent No.: US 8,081,486 B2
(45) Date of Patent: Dec. 20, 2011

(54) ELECTRONIC MODULE

(75) Inventor: Jörg Dorn, Buttenheim (DE)

(73) Assignee: Siemens Aktiengesellschaft, Munich (DE)

( * ) Notice: Subject to any disclaimer, the term of this patent is extended or adjusted under 35 U.S.C. 154(b) by 1028 days.

(21) Appl. No.: 11/917,297

(22) PCT Filed: Jun. 23, 2005

(86) PCT No.: PCT/DE2005/001147
§ 371 (c)(1),
(2), (4) Date: Dec. 12, 2007

(87) PCT Pub. No.: WO2006/136123
PCT Pub. Date: Dec. 28, 2006

(65) Prior Publication Data
US 2008/0207027 A1    Aug. 28, 2008

(51) Int. Cl.
*H01R 9/00* (2006.01)
(52) U.S. Cl. ........ 361/776; 361/624; 361/760; 361/787; 439/76.2; 439/374; 439/620.24; 257/691
(58) Field of Classification Search .................. None
See application file for complete search history.

(56) References Cited

U.S. PATENT DOCUMENTS

| | | | | |
|---|---|---|---|---|
| 5,698,898 A | * | 12/1997 | Matsumoto | 257/712 |
| 5,734,197 A | | 3/1998 | Kelleher et al. | |
| 6,234,842 B1 | * | 5/2001 | Keay et al. | 439/620.24 |
| 6,845,017 B2 | * | 1/2005 | Ahmed et al. | 361/775 |
| 6,881,074 B1 | * | 4/2005 | McLenaghan | 439/70 |
| 7,391,117 B2 | * | 6/2008 | Kirby et al. | 257/773 |
| 7,766,673 B1 | * | 8/2010 | Dumont et al. | 439/76.2 |
| 7,826,231 B2 | * | 11/2010 | Yamabuchi et al. | 361/775 |
| 2003/0031038 A1 | * | 2/2003 | Shirakawa et al. | 363/144 |
| 2003/0187630 A1 | | 10/2003 | Zhang | |
| 2005/0282426 A1 | * | 12/2005 | Nagashima et al. | 439/374 |
| 2007/0029301 A1 | * | 2/2007 | Tokiwa et al. | 219/219 |
| 2010/0265744 A1 | * | 10/2010 | Dorn et al. | 363/123 |

FOREIGN PATENT DOCUMENTS

DE          10103031 A1    7/2002

* cited by examiner

*Primary Examiner* — Courtney Smith
(74) *Attorney, Agent, or Firm* — Laurence A. Greenberg; Werner H. Stemer; Ralph E. Locher

(57) ABSTRACT

An electronic module has at least one first and one second connecting terminal and power semiconductors which are connected by way of connecting conductors, diodes which are each connected in parallel with the power semiconductors and at least one capacitor, likewise connected to the power semiconductors by connecting conductors, which is used, in the event of a fault, to ensure a high degree of availability and operational reliability of a converter; the connecting conductors of the novel device have at least two sections which run parallel to one another and at least one of which can be deformed. The sections are used to guide the current flowing in the electronic module in the opposite direction and are dimensioned such that, when a threshold current is exceeded, they form a conductive connection between the connecting terminals and bridge the power semiconductors and each capacitor.

10 Claims, 4 Drawing Sheets

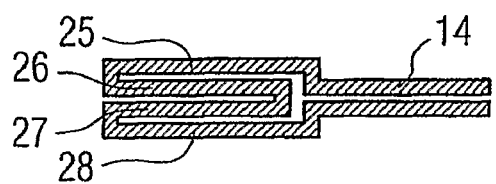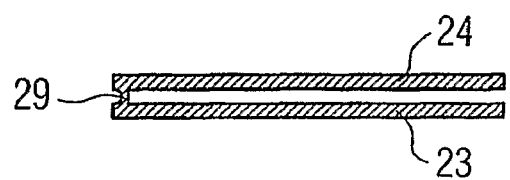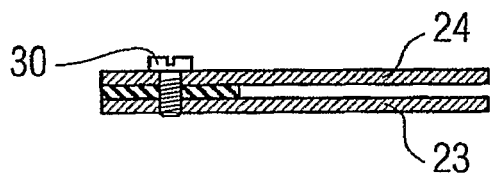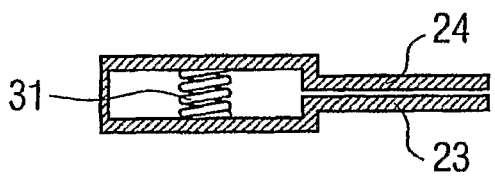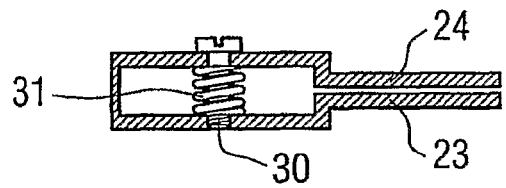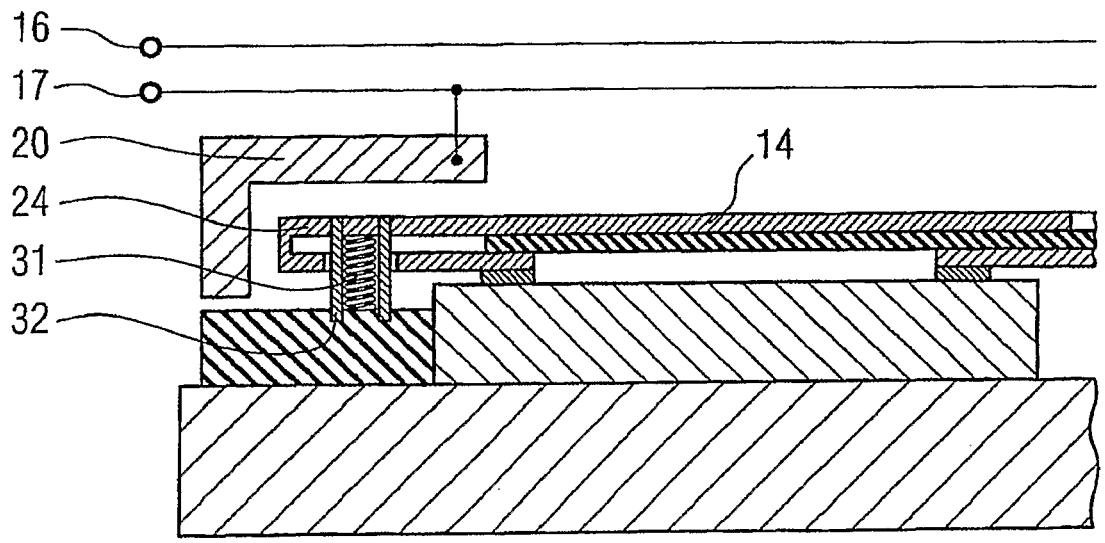

ELECTRONIC MODULE

BACKGROUND OF THE INVENTION

Field of the Invention

The invention relates to an electronic module having at least one first and one second connection terminal as well as power semiconductors which are connected by means of connecting conductors, diodes which are respectively connected in parallel with the power semiconductors and at least one capacitor which is likewise connected to the power semiconductors by means of connecting conductors.

DE 101 03 031 A1 has already disclosed such an electronic module and a series circuit comprising such electronic modules for forming a converter. In the converter which is formed in this manner, the failure of an electronic module, for example on account of a defective component of the circuit arrangement, may result in the entire converter being switched off. This is particularly disadvantageous if the converter is used in power transmission and distribution systems and must have a high level of availability and a high level of operational reliability.

BRIEF SUMMARY OF THE INVENTION

The object of the present invention is to develop an electronic module of the type mentioned initially which can be used to ensure a high level of availability and operational reliability of the converter in the event of a fault.

According to the invention, this object is achieved by virtue of the fact that the connecting conductors have at least two sections which run parallel to one another and at least one of which can be deformed, said sections being used to guide the current flowing in the electronic module in the opposite direction and being dimensioned in such a manner that they form a conductive connection between the connection terminals when a threshold current is exceeded and bridge the power semiconductors and each capacitor.

Such an arrangement advantageously uses a high fault current which occurs in the event of a fault and flows in the electronic module. The sections which run parallel to one another and in which the current flowing in the electronic module is guided in the opposite direction produce a force on account of electromagnetic interaction, which force pushes the connecting conductors apart. The mechanical strength of the deformable sections is set in such a manner that, when a threshold current is exceeded, this force is sufficiently large to effect deformation. The threshold current is, for example, a multiple greater than a nominal current flowing in the electronic module during normal operation. On account of the high capacitance of the capacitor and the low-inductance properties of the connecting conductors, a fault current which occurs, for example, in a defective power semiconductor as a result of the capacitor being discharged is greater than the threshold current, with the result that the deformable section is deformed by the force acting in this case. The term "deformable section" is in no way restricted to irreversible deformation of materials in this case. In the scope of the invention, deformation may also take place using joints or the like, so that irreversible deformation does not take place in the event of a fault. This deformation results in a conductive connection between the connection terminals of the electronic module, with the result that the defective electronic module is bridged. In a series circuit comprising a plurality of electronic modules, as is used in a converter, for example, bridging the defective electronic module makes it possible to continue to operate the converter if the number and driving of the remaining electronic modules of the converter are designed appropriately.

In one preferred embodiment, the deformable sections are realized using busbars which are directly connected to the first connection terminal, the busbars being arranged in the vicinity of a contact part which is directly connected to the second connection terminal. A rigid and thus deformable busbar which is not deformed by the forces acting with a normal nominal current but rather is deformed by the forces acting with a relatively high fault current is moved against a contact part as a result of the deformation and forms the conductive connection between the connection terminals for the purpose of bridging the electronic module in the event of a fault.

In an expedient refinement, the busbars are realized in the form of a busbar which is curved in meandering fashion. In the case of such a meandering or loop-like arrangement, the current flowing in the opposite direction in the subsections results in a repelling force which, in the event of a high fault current, results in sufficient deformation of the busbar that one of the sections forms a conductive connection between the connection terminals of the electronic module. The deformable busbar may also have an arrangement containing, for example, four subsections which are arranged parallel to one another, two adjacent subsections respectively being connected to one another at one end. The use of a plurality of parallel subsections increases the deformation effect caused by the electromagnetic forces.

In one expedient development, curved regions of the busbar have a smaller cross-sectional area than the straight regions. In the case of a connection having a relatively small cross-sectional area, a desired breaking point of the deformable busbar is formed such that, with the forces which occur between the subsections in the event of a fault, the deformable busbar breaks apart at the desired breaking point. As a result, the power semiconductor which is arranged parallel to the connection terminals is disconnected from the circuit. This is particularly advantageous if a further fuse element, for example a so-called disk-type diode which is known as such, is arranged between the connection terminals. A high voltage which is induced by a control unit and is applied to the disk-type diode destroys the latter and forms an additional current path for the load current of the converter.

In another configuration of the invention, means are provided for the purpose of forming a force-fitting connection between one of the deformable sections and the contact part. Such a force-fitting connection between the deformable section and the contact part is advantageous since, in addition to the electrodynamic force, a mechanical force is applied in order to form the conductive connection between the deformable section and the connection terminal. This improves the contact and increases the safety of the operation of bridging the defective electronic module.

In an expedient development, the means comprise a screw connection. Such a screw connection between the two sections can be used to prestress a deformable section, the force occurring in the event of a fault resulting in the screw connection being broken. In this case, the first section which has been prestressed by the screw connection in the direction of the second section is detached and forms a force-fitting connection with the connection terminal.

In another refinement, the means comprise a spring element. In the event of a fault and with the resultant force, a spring element advantageously results in the deformable section being additionally pressed against the contact part, with the result that the contact or the connection between the deformable section and the contact part is advantageously improved.

In an expedient development, the spring element is arranged between the deformable sections. As a result of such an arrangement, a deformable section is pressed against the contact part by the force exerted by the spring element on the deformable section.

In another embodiment, the spring element may be arranged on the contact part. Arranging the spring element on the contact part is another expedient design for improving the conductive connection between the deformable section and the contact part.

In an expedient configuration of the invention, means are provided for the purpose of forming a form-fitting connection between the deformable busbar and the terminal. A form-fitting connection likewise makes it possible to improve the properties of the conductive connection and thus the safety of the operation of bridging a defective electronic module. Such a form-fitting connection between the contact part and the deformable section may be formed, for example, by a latching mechanism in which a molding on the deformable section is pressed against a second molded part arranged on the contact part by the force generated by the short-circuit current and latches into said second molded part.

The invention is described below using exemplary embodiments and with reference to figures of the drawing, in which:

BRIEF DESCRIPTION OF THE SEVERAL VIEWS OF THE DRAWING

FIGS. 4a to 4e show exemplary embodiments of a deformable busbar;

FIG. 5 shows a schematic illustration of a second embodiment of an electronic module according to the invention;

DESCRIPTION OF THE INVENTION

Figure 1:
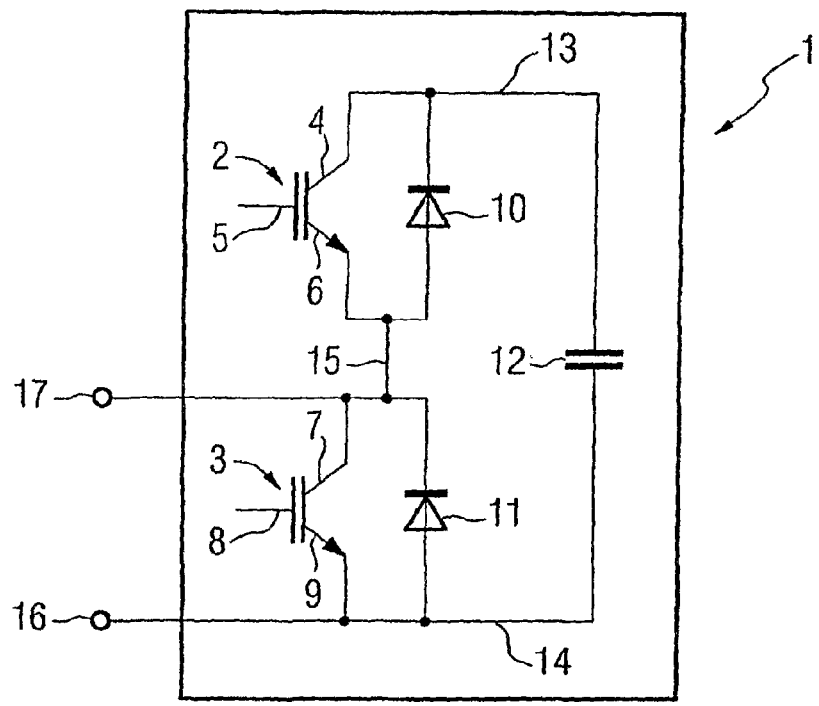
FIG. 1 shows a schematic illustration of the circuit arrangement of an electronic module.

FIG. 1 shows a circuit arrangement of an electronic module known from DE 101 03 031 A1. The function of the electronic module 1 and the arrangement of a plurality of electronic modules in a series circuit in a converter are described in DE 101 03 031 A1 which is hereby completely part of the present disclosure. The electronic module 1 comprises two IGBTs 2, 3 with respective emitter connections 4, 7, gate connections 5, 8 and collector connections 6, 9. Freewheeling diodes 10, 11 are respectively connected in parallel with the IGBTs 2, 3. A capacitor 12 is connected to the IGBTs and the freewheeling diodes by means of connecting conductors 13, 14. A further connecting conductor 15 connects the IGBTs 2, 3 to one another. The electronic module 1 also has connection terminals 16, 17.

Figure 2:
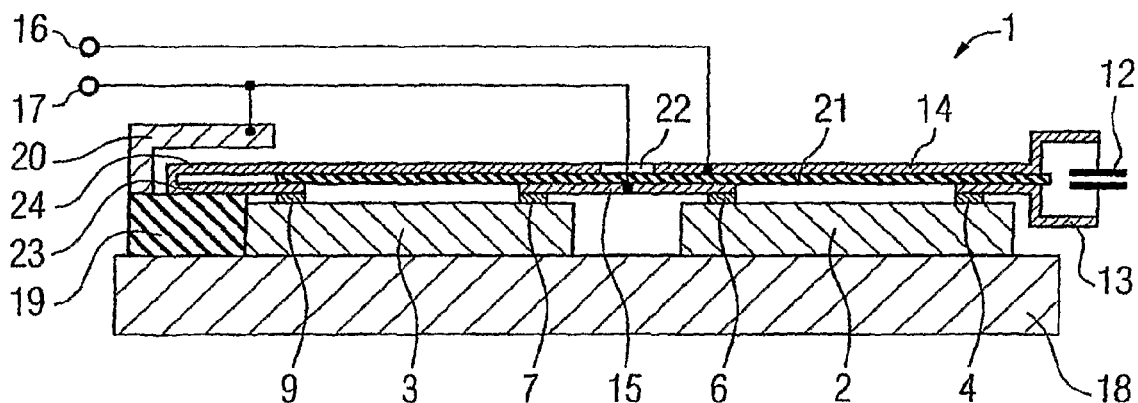
FIG. 2 shows a schematic cross-sectional view of an electronic module according to the invention in a first state.

FIG. 2 shows a schematic cross-sectional view of an electronic module 1 in which the respective gate connections 5, 8 of the IGBTs 2, 3 and the diodes 10, 11 which are connected in parallel are not illustrated for the purpose of simplification. The IGBTs 2, 3 are fastened to a heat sink 18. A contact part 20 which is conductively connected to the connection terminal 17 is arranged on an insulating body 19. The connecting conductor 14 is separated from the connecting conductors 13 and 15 by means of an insulating layer 21. The connection terminal 16 is conductively connected to the connecting conductor 14 and the connection terminal 17 is conductively connected to the contact part 20 and to the connecting conductor 15. The connection terminal 17 is connected to the connecting conductor 15 by means of a recess 22 which is arranged in the connecting conductor 14 and is insulated from the connecting conductor 14. In the region of the contact part 20, the connecting conductor 14 has a loop which is U-shaped in the side view shown and has two deformable sections 23 and 24 which are arranged parallel to one another. In other words, the connecting conductor 14 extends in a meandering fashion in the vicinity of the contact part 20. The currents which flow in the opposite direction in the connecting conductor 14 on one side and in the connecting conductors 13 and 15 on the other side during normal operation of the electronic module generate electrodynamic forces which are absorbed by the insulation 21 that is adhesively bonded to the connecting conductors and do not suffice to move the sections 23 and 24 apart. However, if a component of the electronic module is defective, the capacitor 12 may discharge, in which case a very high discharge current occurs on account of the large capacitance of the capacitor 12 and the low-inductance properties of the connecting conductors 13, 14, 15. Such a discharge or fault current flowing in the opposite direction in the deformable sections 23 and 24 results in a repelling force between the deformable sections 23 and 24.

Figure 3:
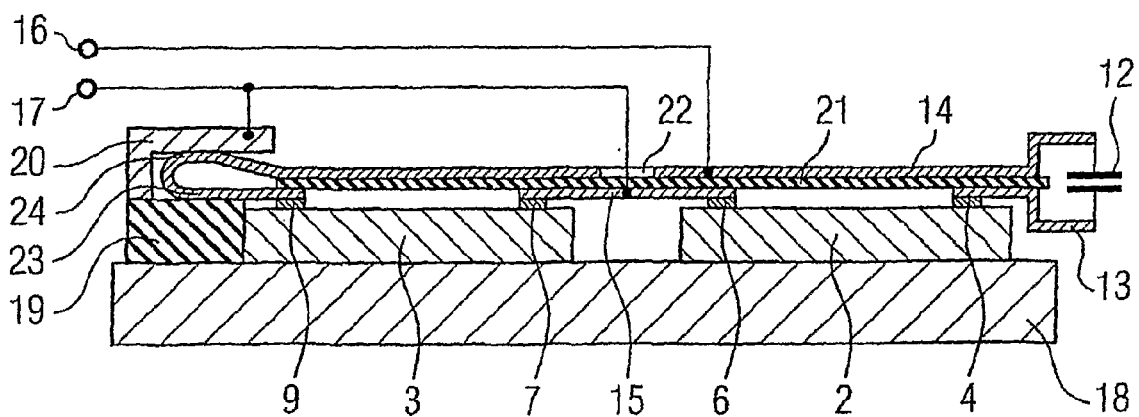
FIG. 3 shows a schematic cross-sectional view of the electronic module from FIG. 2 in a second state.

FIG. 3 illustrates the electronic module in a state in which the capacitor 12 has discharged on account of a defective component and has generated a discharge current which results in the deformation described above. On account of the deformation, the section 24 makes contact with the contact part 20 and thus forms a connection between the connection terminals 16, 17. This connection between the connection terminals 16, 17 is switched in such a manner that the defective electronic module is thus bridged.

FIG. 4a shows another possible way of configuring the connecting conductor 14, in which, instead of the U-shaped loop with two parallel deformable sections according to FIG. 2, a loop-shaped arrangement with four deformable sections or conductor pieces 25, 26, 27, 28 which are arranged parallel to one another is formed. Such an arrangement intensifies the above-described deformation effect of the arrangement since a current flows in the opposite direction in a plurality of pairs of conductor pieces 25 and 26 or 26 and 27 or 27 and 28, with the result that a repelling force between the respective conductor pieces is intensified on account of electromagnetic effects.

FIG. 4b illustrates another possible way of forming the U-shaped loop arrangement of the connecting conductor 13 with two parallel sections 23 and 24. In this exemplary embodiment, the curved connection 29 between the deformable sections 23 and 24 is formed with a smaller cross-sectional area than the cross-sectional area of the sections 23 and 24. This defines a desired breaking point on the connection 29, with the result that the connection between the sections 23 and 24 breaks open at the desired breaking point 29 with the force generated by the fault current. As already described in connection with FIG. 3, the section 24 is pressed against the contact part 20 and forms a short circuit between the connection terminals 16 and 17.

FIG. 4c illustrates another embodiment of the invention. In this exemplary embodiment, the sections 23 and 24 are connected by means of a screw 30, the force generated in the event of a fault current resulting in the thread of the plastic screw 30 being sheared off, with the result that the connection between the sections 23 and 24 is interrupted and the section 24 is pressed against the contact part 20 and likewise forms a connection between the connection terminals 16 and 17.

FIG. 4d illustrates another exemplary embodiment in which the U-shaped loop arrangement of the sections 23 and 24 undergoes additional prestressing by means of a spring element 31. The spring element 31 exerts an additional force on the deformable section 24, with the result that the conductive connection produced by the section 24 between the connection terminals 16 and 17 is improved by the additional force of the spring element 31.

FIG. 4e illustrates a combination of a screw 30 with a spring element 31 for the purpose of connecting the sections 23 and 24.

FIG. 5 shows another exemplary embodiment of a combination of a spring element 31 with an auxiliary element 32 which is screwed to the insulation and absorbs the spring force of the spring element 31. In the event of a fault current, the screw connection of the auxiliary element 32 is sheared off by the electrodynamic force, with the result that the spring force of the spring element 31 presses the deformable section 24 against the contact part 20 and forms the connection between the connection terminals 16 and 17.

Figure 6:
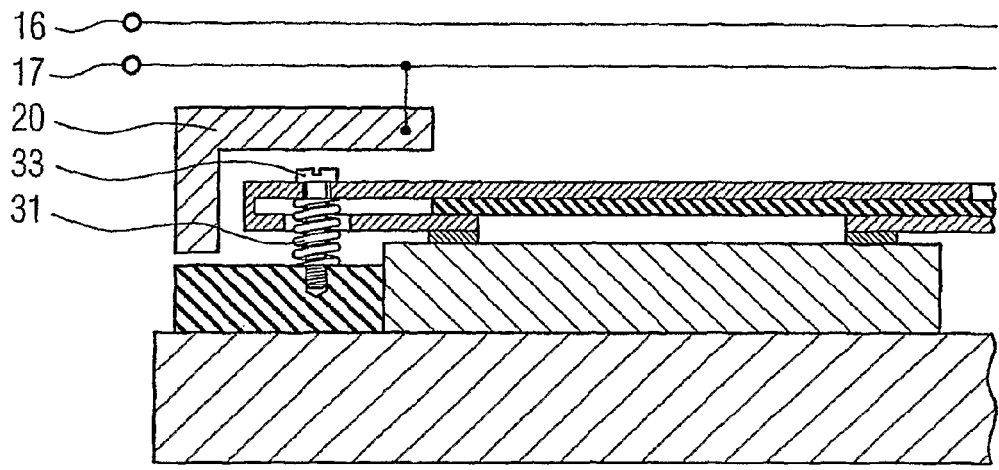
FIG. 6 shows a schematic illustration of a third embodiment of an electronic module according to the invention.

FIG. 6 shows an expedient refinement of the exemplary embodiment from FIG. 5, in which the auxiliary element 32 is formed by a screw 33.

Figure 7:
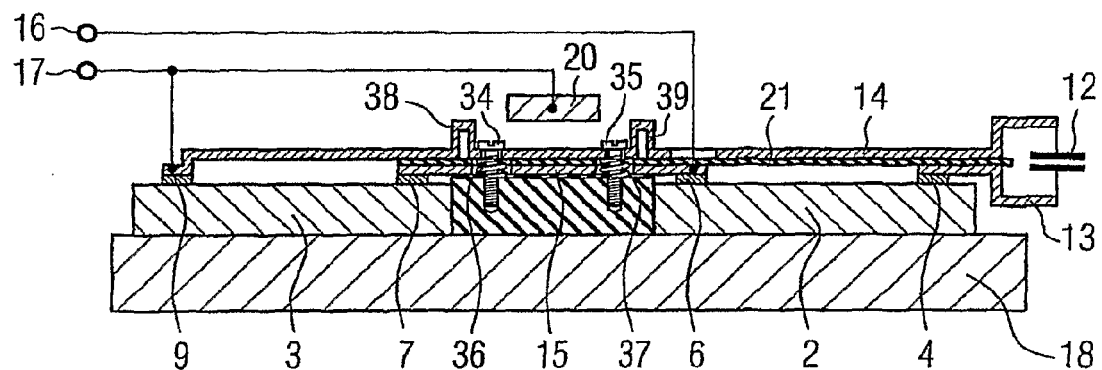
FIG. 7 shows a schematic illustration of a fourth embodiment of an electronic module according to the invention.

FIG. 7 illustrates another refinement of the electronic module according to the invention, in which the contact part 20 is arranged in such a manner that, in the event of a fault current which flows in the opposite direction in the connecting conductors 14 and 15 and thus results in a repelling force between said conductors, the connecting conductor 14 is deformed and is pressed against the contact part 20. In this case, the insulation 21 is not adhesively bonded to the connecting conductors 14 and 15 but rather is fastened using screws 34 and 35. Spring elements 36, 37 are arranged on the screws, which, in the event of a fault, intensify the deformation of the connecting conductor 14 by the repelling force. Adjacent to the spring elements, the connecting conductor 14 has, in the side view shown, upwardly pointing conductor loops 38, 39 which are provided for the deformation of the connecting conductor 14 in the direction of the contact part, the effect of which is described with reference to FIG. 10. In the event of a fault, the connecting conductor 14 is pressed against the contact part 20 by the electrodynamic force and the spring force, as a result of which the connection between the connection terminals 16 and 17 is formed.

Figure 8:
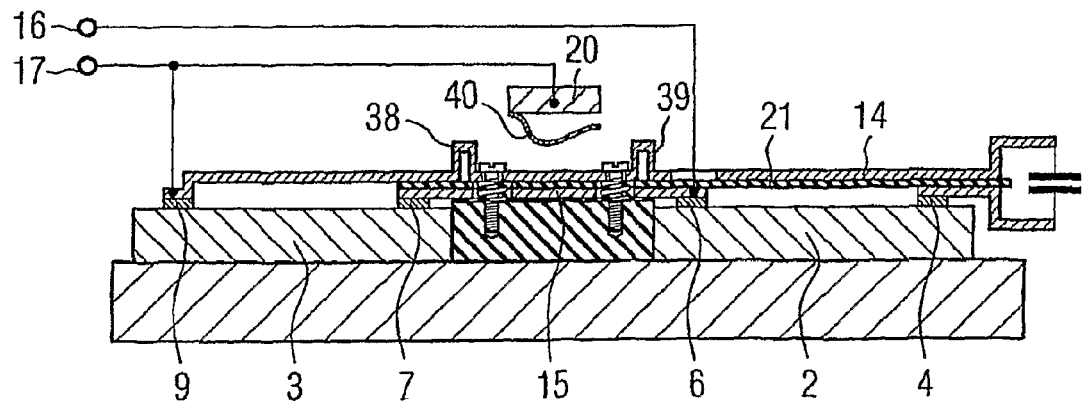
FIG. 8 shows a schematic illustration of a fifth embodiment of an electronic module according to the invention.

FIG. 8 shows another embodiment of the electronic module according to the invention from FIG. 7, in which a spring element 40 is arranged on the contact part 20, with the result that the connecting conductor 14 which has been deformed by the electromagnetic force in the event of a short circuit is pressed against the spring element 40 and forms a safe connection between the connection terminals 16 and 17.

Figure 9:
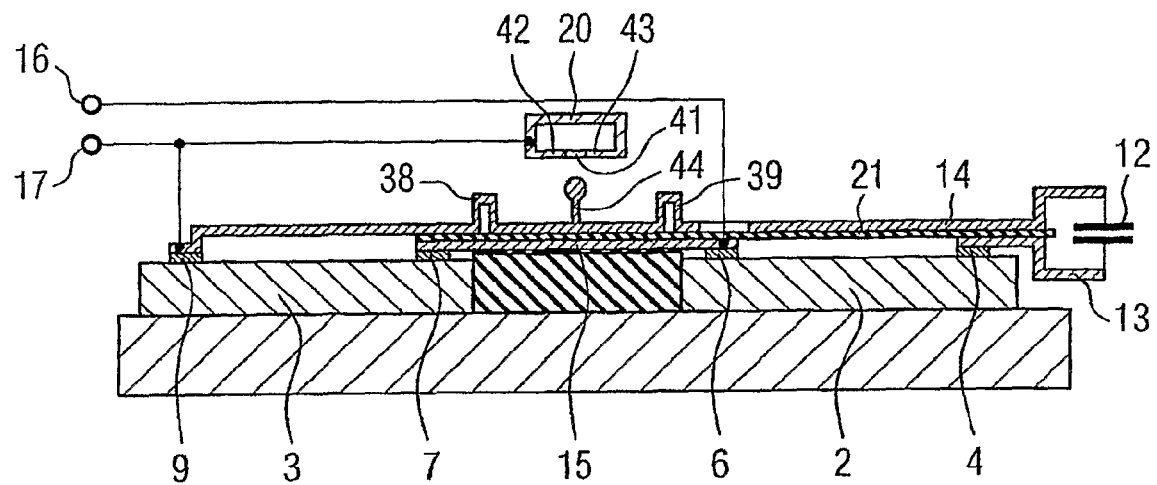
FIG. 9 shows a schematic illustration of a sixth embodiment of an electronic module according to the invention.

FIG. 9 shows another embodiment of the connection between the deformable connecting conductor 14 and the contact part 20. The contact part 20 has a recess 41 and elastic parts 42 and 43. A molding 44 is arranged on the connecting conductor 14. In the case of the electromagnetic force which occurs in the event of a short circuit between the connecting conductors 14 and 15, the molding 44 is moved upward in the direction of the contact part 20, the molding deforming the elastic parts 42 and 43 upward using the sufficiently large force and latching with the elastic parts 42 and 43 through the recess 41, with the result that a connection is formed between the connection terminals 16 and 17.

Figure 10:
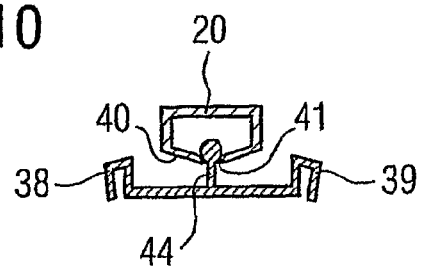
FIG. 10 shows a detail view of FIG. 9.

FIG. 10 shows the form-fitting connection between the molding 44 and the contact part 20 in a latched position after the short-circuit current has flowed in the electronic module. The connecting conductor 14 is deformed by the electrodynamic force, the conductor loops 38, 39 respectively being bent in the direction pointing away from the molding 44, with the result that the connecting conductor 14 is deformed upward and the molding 44 latches with the elastic parts 42 and 43 through the recess 41 and forms a form-fitting connection between the molding 44 and the contact part 20. Other latching mechanisms for forming a form-fitting connection can also be achieved within the scope of the invention.

| List of reference symbols | |
|---|---|
| 1 | Electronic module |
| 2, 3 | IGBT |
| 4 | Emitter connection |
| 5 | Gate connection |
| 6 | Collector connection |
| 7 | Emitter connection |
| 8 | Gate connection |
| 9 | Collector connection |
| 10, 11 | Freewheeling diodes |
| 12 | Capacitor |
| 13, 14, 15 | Connecting conductors |
| 16, 17 | Connection terminals |
| 18 | Heat sink |
| 19 | Insulation body |
| 20 | Contact part |
| 21 | Insulation |
| 22 | Recess |
| 23, 24 | Sections |
| 25, 26, 27, 28 | Conductor sections |
| 29 | Connection |
| 30 | Plastic screw |
| 31 | Spring element |
| 32 | Auxiliary element |
| 33 | Plastic screw |
| 34, 35 | Screws |
| 36, 37 | Spring elements |
| 38, 39 | Conductor loops |
| 40 | Spring element |
| 41 | Recess |
| 42, 43 | Elastic parts |
| 44 | Molding |

The invention claimed is:

1. An electronic module, comprising:
a first connection terminal and a second connection terminal;
a plurality of power semiconductors;
diodes respectively connected in parallel with said power semiconductors; and
at least one capacitor connected to said power semiconductors;
a plurality of connecting conductors connecting said power semiconductors to one another and connecting said at least one capacitor to said power semiconductors, said connecting conductors having at least two sections running parallel to one another and including at least one deformable conductor capable of deformation, said sections being disposed to guide a current flowing in the electronic module in an opposite direction such that a force on account of an electromagnetic interaction is produced that pushes said connecting conductors apart, said sections being dimensioned to form a conductive connection between said connection terminals when a threshold current is exceeded and to bridge said power semiconductors and each said capacitor;

wherein said at least one deformable section is a busbar directly connected to said first connection terminal, and said busbar is disposed in a vicinity of a contact part directly connected to said second connection terminal.

2. The electronic module according to claim 1, wherein said busbar is a curved busbar following a meandering form.

3. The electronic module according to claim 2, wherein said busbar is formed with curved regions and straight regions, and said curved regions have a smaller cross-sectional area than said straight regions.

4. The electronic module according to claim 1, which comprises means for forming a force-locking connection between one of said deformable sections and said contact part.

5. The electronic module according to claim 4, wherein said means comprise a screw connection.

6. The electronic module according to claim 4, wherein said means comprise at least one spring element.

7. The electronic module according to claim 6, wherein said at least one deformable section is one of a plurality of deformable sections and said spring element is disposed between said deformable sections.

8. The electronic module according to claim 6, wherein said spring element is disposed on a contact part directly connected to said second connection terminal.

9. The electronic module according to claim 1, which further comprises means for forming a form-fitting connection between said at least one deformable section and said contact part.

10. An electronic module, comprising:
a first connection terminal and a second connection terminal;
a plurality of power semiconductors;
diodes respectively connected in parallel with said power semiconductors; and
at least one capacitor connected to said power semiconductors;
a plurality of connecting conductors connecting said power semiconductors to one another and connecting said at least one capacitor to said power semiconductors, said connecting conductors having at least two sections running parallel to one another and including at least one deformable conductor capable of deformation, said sections being disposed to guide a current flowing in the electronic module in an opposite direction and being dimensioned to form a conductive connection between said connection terminals when a threshold current is exceeded and to bridge said power semiconductors and each said capacitor;

wherein said at least one deformable section is a busbar directly connected to said first connection terminal, and said busbar is disposed in a vicinity of a contact part directly connected to said second connection terminal.

* * * * *